(12) United States Patent
Chuang et al.

(10) Patent No.: US 7,199,035 B2
(45) Date of Patent: Apr. 3, 2007

(54) INTERCONNECT JUNCTION PROVIDING REDUCED CURRENT CROWDING AND METHOD OF MANUFACTURING SAME

(75) Inventors: Harry Chuang, Austin, TX (US); Chen-Chia Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 141 days.

(21) Appl. No.: 10/878,708

(22) Filed: Jun. 28, 2004

(65) Prior Publication Data
US 2005/0287784 A1 Dec. 29, 2005

(51) Int. Cl.
*H01L 21/44* (2006.01)
*H01L 21/4763* (2006.01)
*H01L 23/48* (2006.01)
*H01L 23/52* (2006.01)
*H01L 29/40* (2006.01)

(52) U.S. Cl. .................. 438/599; 438/618; 257/773

(58) Field of Classification Search ................ 438/598, 438/599, 618; 174/261; 257/773
See application file for complete search history.

(56) References Cited
U.S. PATENT DOCUMENTS
5,371,411 A 12/1994 Hara et al.
5,539,257 A 7/1996 Hara et al.
5,552,639 A 9/1996 Hara et al.
5,633,198 A * 5/1997 Lur et al. .................... 438/618

OTHER PUBLICATIONS
S. Wolf and R.N. Tauber, Silicon Processing for the VSLI Era, vol. 1, Second Edition, Lattice Press, 2000, pp. 791-793.*

* cited by examiner

Primary Examiner—Carl Whitehead, Jr.
Assistant Examiner—Heather A. Doty
(74) Attorney, Agent, or Firm—Baker & McKenzie LLP

(57) ABSTRACT

Disclosed herein are a junction where electrical interconnects on a semiconductor substrate intersect and a method of manufacturing a junction where electrical interconnects on a semiconductor substrate intersect is disclosed. In one embodiment, the junction includes a portion of at least one current providing electrical interconnect having a length parallel to a longitudinal axis thereof and configured to provide a flow of electrical current. In addition, the junction includes a portion of at least one current receiving electrical interconnect having a length parallel to a longitudinal axis thereof and configured to intersect with the at least one current providing interconnect at the junction in order to receive the flow of electrical current from the at least one current providing interconnect. Also, in such an embodiment, the junction includes at least one current directing feature positioned between the current providing and current receiving interconnects, and oriented substantially non-perpendicular to the longitudinal axis of the at least one current providing interconnect.

53 Claims, 4 Drawing Sheets

INTERCONNECT JUNCTION PROVIDING REDUCED CURRENT CROWDING AND METHOD OF MANUFACTURING SAME

TECHNICAL FIELD

Disclosed embodiments herein relate generally to junctions and corners among electrical interconnects on semiconductor substrates, and more particularly to interconnect junctions providing reduced current crowding and related methods of manufacturing the same.

BACKGROUND

Integrated circuits (ICs) are formed on semiconductor wafers, where the wafers are separated into individual dies or chips and the individual chips are then packaged by mounting and wire-bonding the chip on a substrate. Once mounted, the chip is encapsulated to protect it from environmental contaminants. Thus, the packaging process is one of the most critical steps in the IC fabrication process, both from the point of view of cost and of reliability. Unfortunately, even the most carefully packaged IC devices can still experience problems if faults or other weaknesses are present in the individual components, such as the mounting substrate.

One common point of failure is in the power bus traces that are formed on the substrates to facilitate electrical connections to circuit components across the substrate. For example, conductive traces (or "interconnects") are typically formed throughout the interior of the substrate as the "power pad" connections that provide applied power to circuit components. In addition, other interconnects are typically formed around the periphery of the substrate (e.g., a "power ring") to provide the ground or reference potential for circuit components. Unfortunately, however, interconnect junctions, where such sets of interconnects join/intersect each other or have sharp turns, are often points of weakness in the packaged device due to "current crowding" at these junctions.

Current crowding results when a flow of electrical current builds up at a certain place along the interconnects, which is typically where sharp angles are present either when a single interconnect changes direction sharply or where multiple interconnects intersect. Since the flow of electrical current typically behaves like a flow of water, such junctions should be designed to promote the flow of current in an effort to reduce or prevent current crowding. In modern devices, holes or slots are typically formed in the junctions to relieve stress on interconnects formed at the periphery of the substrate often caused by manufacturing process. However, these holes/slots often exacerbate the problem of current crowding by causing current flowing into the junction to be deflected in random directions, rather than towards an interconnect. If not deflected in the proper direction, current will begin to crowd in the junction, which may result in an electrical burn-out. In addition, such holes/slots remove conductive area from the interconnect/junction, which reduces the maximum amount of current (i.e., current density) that can be present in the junction before a burn-out occurs. Accordingly, what is needed is an interconnect junction for use on semiconductor substrates that does not suffer from the deficiencies found in the prior art.

BRIEF SUMMARY

Disclosed herein is a junction used to direct electrical current flowing into it in one direction toward another direction where electrical interconnects on a semiconductor substrate intersect or where an interconnect takes a sharp turn. In one embodiment, the junction includes a portion of at least one current providing electrical interconnect having a length parallel to a longitudinal axis thereof and configured to provide a flow of electrical current. In addition, the junction includes a portion of at least one current receiving electrical interconnect having a length parallel to a longitudinal axis thereof and configured to intersect with the at least one current providing interconnect at the junction in order to receive the flow of electrical current from the at least one current providing interconnect. Also, in such an embodiment, the junction includes at least one current directing feature positioned between the current providing and current receiving interconnects, and oriented substantially non-perpendicular to the longitudinal axis of the at least one current providing interconnect.

In another aspect, disclosed is a method of manufacturing a junction where electrical interconnects on a semiconductor substrate intersect and used to direct electrical current flowing into it in one direction toward another direction. In one embodiment, the method includes forming a portion of at least one current providing electrical interconnect having a length parallel to a longitudinal axis thereof and configured to provide a flow of electrical current. The method also includes forming a portion of at least one current receiving electrical interconnect having a length parallel to a longitudinal axis thereof and configured to intersect with the at least one current providing interconnect at the junction. Also, in such an embodiment, the method includes positioning at least one current directing feature between the current providing and current receiving interconnects, and orienting at least one deflecting surface of the at least one feature substantially non-perpendicular to the current flow from the at least one current providing interconnect.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION OF PREFERRED EMBODIMENTS

Figure 1:
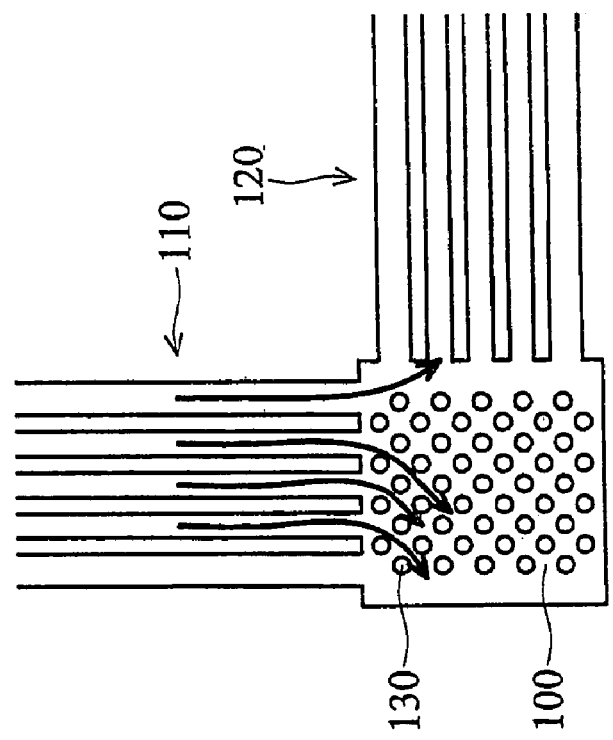
FIG. 1 illustrates a conventional junction where two electrical interconnects intersect or one interconnect has a sharp turn.

Referring initially to FIG. 1, illustrated is a conventional junction 100 where electrical interconnects 110, 120 intersect or when one interconnect sharply turns. As illustrated, interconnect 110 is orientated substantially perpendicular to interconnect 120, as is commonly found in modern circuitry. Also illustrated are a group of non-conducting obstacles 130 formed in the junction 100. These obstacles 130 are typically holes or slots cut into the conductive material in the junction 100 for resisting cracking at locations near the periphery of the substrate, as mentioned in above.

If electrical current is configured to flow from interconnect 110 to the junction 100 and then through interconnect 120, the current must turn at about a right angle at the junction 100 during its flow to interconnect 120. However, as the current flows into the junction 100, the current crowding problem discussed above begins to develop due to the sharpness of the turn. Those who are skilled in the pertinent field of technology understand that the flow of electrical current behaves similar to a flow of water when moving through the electrical interconnects 110, 120. As such, the current begins to accumulate in the junction 100 until it begins to overflow into interconnect 120 because it is not directed towards interconnect 120. As the current accumulates in the junction 100, the conductive material comprising the junction 100 may burn-out and damage the operation of the circuit if its maximum current density is exceeded. This problem is typically more common when the interconnects 110, 120 are power bus interconnects that carry a large amount of current for the circuit. Moreover, in this conventional design, the obstacles 130 may exacerbate the problem of current crowding with their circular shape, which may tend to deflect the incoming current flow in any number of directions at the junction 100, rather than directing the current flow in the intended direction.

Figure 2:
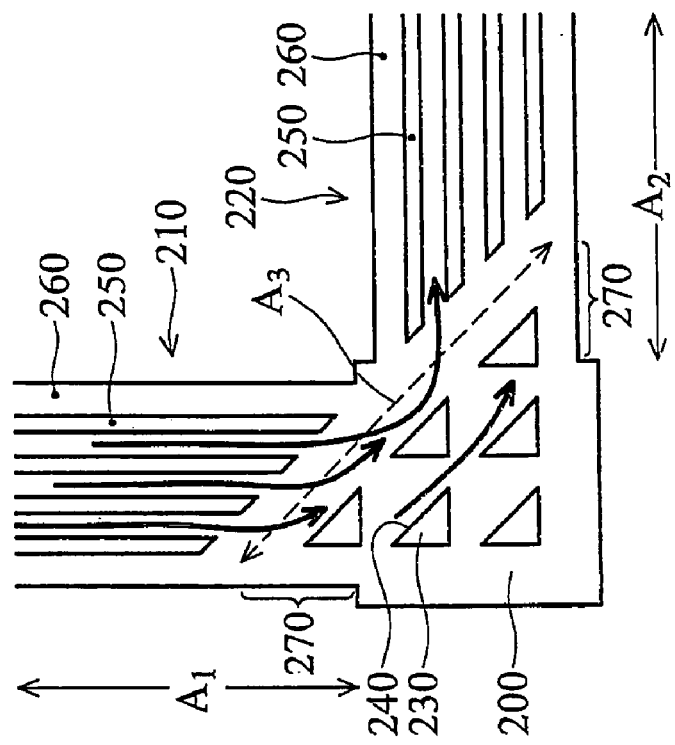
FIG. 2 illustrates one embodiment of a junction with triangular current deflecting devices for use where electrical interconnects intersect or turn.

Turning now to FIG. 2, illustrated is one embodiment of a junction 200 where electrical interconnects 210, 220 intersect constructed according to the principles disclosed herein. In this embodiment, interconnect 210 has a length parallel to a longitudinal axis A1 and is configured to provide a flow of electrical current along this longitudinal axis A1. Also, interconnect 220 has a length parallel to a longitudinal axis A2 and is configured to receive the flow of electrical current along this longitudinal axis A2 from the current providing interconnect 210. The interconnects 210, 220 intersect each other at substantially a right angle at the junction 200. Of course, in other embodiments, there may simply be a single interconnect having a turn at substantially a right angle, where the turn may be considered the junction 200.

As with the junction 100 in FIG. 1, interconnect 210 is orientated substantially perpendicular to interconnect 220. However, in this embodiment, the junction 200 includes a number of current directing features, which in this embodiment are current deflecting devices (one of which is labeled 230), rather than the obstacles 130 discussed above. The current deflecting devices 230 can serve to reduce stress just like the conventional obstacles 130, but they also provide significant benefits in accordance with the principles disclosed herein. More specifically, each of the current deflecting devices 230 includes a deflecting surface 240 that is non-perpendicular to the current flow from the current providing interconnect 210. As such, this deflecting surface 240 is oriented to deflect a portion of the current flowing from interconnect 210 towards the current receiving interconnect 220. In the illustrated embodiment, the deflecting surface 240 is oriented at about 45 degrees with respect to both the current providing interconnect 210 and the current receiving interconnect 220, as illustrated with axis A3 since interconnect 210 and interconnect 220 intersect at about a right angle. Of course, in other embodiments, the orientation of the deflecting surface 240 may be selected so as to provide the best electrical current flow from one interconnect to another, even if those interconnects do not intersect substantially a right angle. For example, if interconnects 210 and 220 intersect at about 135 degrees, then the current deflecting surfaces 240 may be oriented at about 22.5 degrees with respect to both interconnects 210, 220.

Also illustrated in FIG. 2, interconnect 210 may by a "power pad" interconnect and interconnect 220 may be a "power ring" interconnect, where both are formed having a number of non-conductive spaces (one of which is labeled 250) extending most of their respective lengths. These spaces 250 are typically provided in an effort to reduce the chance of cracking or other type of failure of the interconnects 210, 220. For example, metal "dishing" issues as a result of the planarization process often occur since metal layers are typically softer than adjacent non-conductive layers in such devices. The spaces 250 in essence divide each of the interconnects 210, 220 into a group of parallel, but electrically interconnected, metal traces (one of which is labeled 260), typically in the range of 20% to 80% metal trace material per interconnect. To help balance the electrical performance (e.g., less non-conductive area in interconnects 210 and 220) and to help prevent potential dishing in interconnects during the planarizing process (e.g., more non-conductive area with higher hardness to prevent dishing issues), the pattern density of 20% to 80% has been found to be an advantageous range.

As can be seen in this embodiment, when such traces 260 and spaces 250 are employed, the lengths of the spaces 250 and traces 260 may be tapered when moving from one side of the interconnect 210, 220 to the other. When this tapering is employed, the deflecting devices 230 may be carried up into a portion (denoted by 270) of the interconnect 210, 220 to further assist in directing the flow of electrical current from one interconnect 210 to the other 220. While not required, such an embodiment provides for even more reduction in current crowding at the junction 200 by creating any even smoother linear transition (e.g., along the direction shown with axis A3) from interconnect 210 to the interconnect 220. More specifically, the current flowing from the shortest traces 260 is directed towards interconnect 220 because of this tapering, and thus is already beginning to flow towards interconnect 220 when it encounters the current deflecting devices 230. As a result, the potential for current crowding is even further reduced.

In many embodiments, the spaces 250 may be formed by replacing certain areas of the interconnect 210, with non-conductive materials in the pre-determined areas. The non-conductive materials are usually dielectric materials such as silicon oxide, silicon nitride, or low-k dielectrics if a further increase in interconnect performance is desired. Typically low-k dielectrics can be chosen form: Fluorine-doped glass (FSG), Black Diamond® or BLOk™ (both manufactured by Applied Materials Corp.), SiLK™ (manufactured by Dow Chemical Corp.), FLARE™ (manufactured by Allied Signal Corp.), or even combinations thereof.

Figure 3:
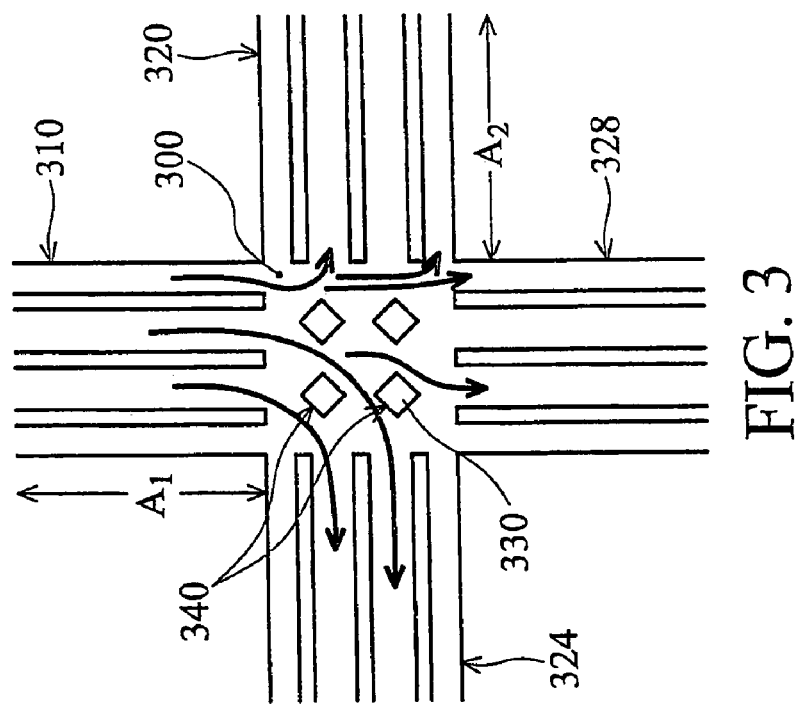
FIG. 3 illustrates another embodiment of a junction with diamond-shaped current deflecting devices for use where four electrical interconnects intersect.

Looking now at FIG. 3, illustrated is another embodiment of a junction 300 where four electrical interconnects intersect according to the principles disclosed herein. In this embodiment, interconnect 310 again has a length parallel to a longitudinal axis A1 and is configured to provide a flow of electrical current along this longitudinal axis A1. Also, interconnect 320 has a length parallel to a longitudinal axis A2 and is configured to receive the flow of electrical current along this longitudinal axis A2.

Also included in this embodiment are third and fourth interconnects 324, 328. In one circuit design, the third interconnect 324 is also a current providing interconnect 324, and is shown formed along axis A2 substantially perpendicular to the first current providing interconnect 310 and substantially parallel to the first current receiving interconnect 320. In addition, a second current receiving interconnect 328 is provided and formed along axis A1, substantially perpendicular to the first current receiving interconnect 320 and substantially parallel to the first current providing interconnect 310. In this embodiment, the interconnects 310, 320, 324, 328 are electrically connected in a substantially perpendicular manner at the junction 300, however this is not always the case. Moreover, the interconnects 310, 310, 324, 328 may simply be two interconnects crossing each other, where the intersecting point is considered the junction 300.

In accordance with the principles disclosed herein, the junction 300 further includes current deflecting devices 330 therein. As shown, the current deflecting devices 330 in this embodiment have a diamond shape, with the points of the diamond oriented towards the interconnects 310, 320, 324, 328. More specifically, since electrical current can flow in almost any direct across the junction 300, the current deflecting devices 330 are beneficially shaped so that there is no deflecting side 340 of the current deflecting devices 330 that is perpendicular to the longitudinal axes A1, A2 of the interconnects 310, 320, 324, 328. Thus, any of the interconnects 310, 320, 324, 328 may be considered "current providing" or "current receiving." Beneficially, if the four interconnects 310, 320, 324, 328 are substantially perpendicular at the junction 300, then the illustrated diamond shape of the current deflecting devices 330 can provide an optimal angle of 45 degrees with respect to the longitudinal axes A1, A2 of the interconnects. As a result, the flow of electrical current can pass easily through the junction 300 by being deflected by the current deflecting devices 330 in the direction provided by the deflecting sides 340, rather than crowding in the junction 300 by flowing into a perpendicular surface or a surface directing the current flow in any improper or random direction. As with the formation of the spaces 250 discussed with reference to FIG. 2, in many embodiments the current deflecting devices 330 may be formed by replacing certain areas of the junction 300 with non-conductive materials in pre-determined areas. Exemplary non-conductive materials may typically be those mentioned above with respect to the spaces 250.

Figure 4:
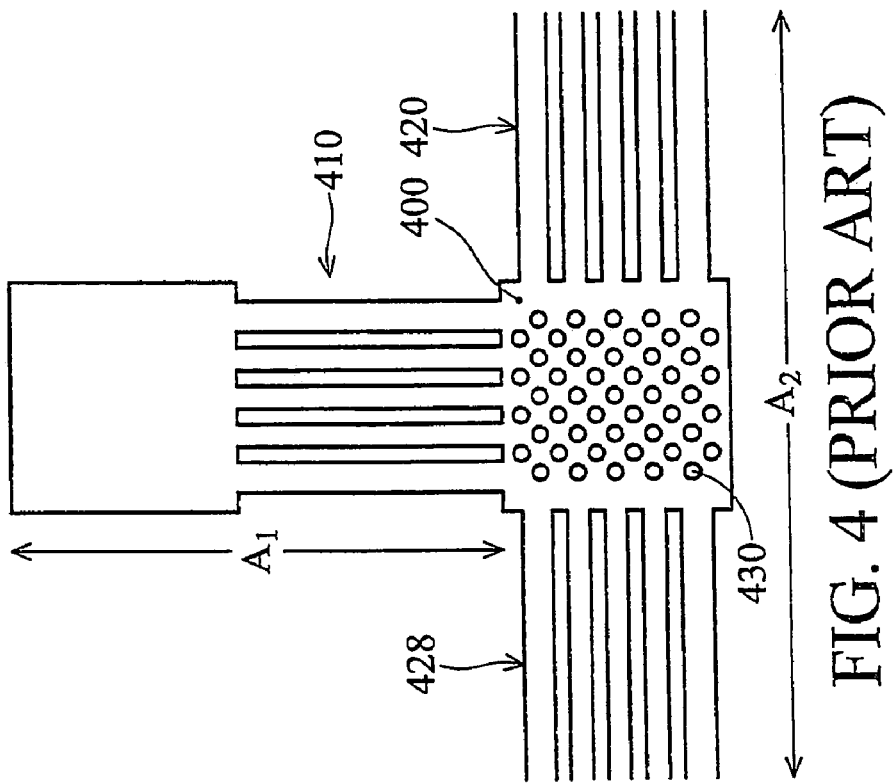
FIG. 4 illustrates an embodiment of a conventional junction where three electrical interconnects intersect.

Referring now to FIG. 4, illustrated is another embodiment of a conventional junction 400 where electrical interconnects intersect. Interconnect 410 has a length parallel to a longitudinal axis A1 and is orientated substantially perpendicular to interconnect 420, which has a length parallel to a longitudinal axis A2. A third interconnect 428 is also provided and has a length parallel to longitudinal axis A2, as well. With this configuration, interconnects 420 and 428 may both be configured to receive a flow of electrical current from interconnect 410, for example, if interconnect 410 connects to a power pad, which means interconnect 410 is coupled to an electrical source, and interconnects 420, 428 are part of a power ring (electrical ground), however a different path of current flow may also be provided.

Also illustrated are a group of non-conducting obstacles 430 formed in the junction 400. Like those of FIG. 1, these obstacles 430 are typically holes cut into the conductive material in the junction 400 for resisting cracking in interconnects located near the periphery of the substrate. Also as before, however, as electrical current flows from interconnect 410 through the junction 400 and into interconnects 420, 428, the current must again turn at about a right angle in the junction 100 regardless of which receiving interconnect 420, 428 receives the current. As a result, current crowding will typically develop due to the sharpness of the turn. Furthermore, the circular design of the obstacles 430, which is the design typically found, exacerbates the current crowding by deflecting the incoming current flow in multiple directions at the junction 400.

Figure 5:
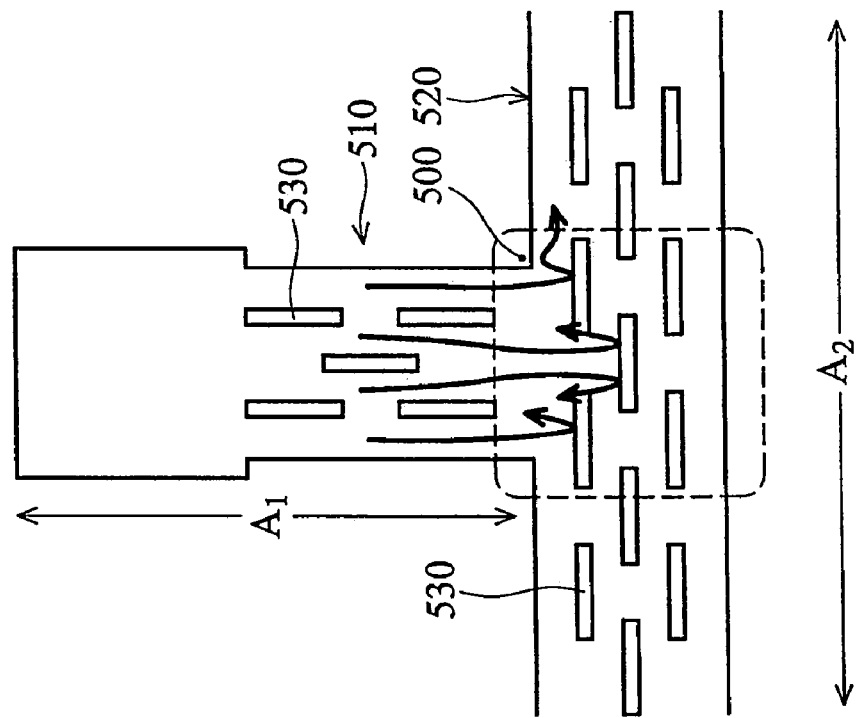
FIG. 5 illustrates another embodiment of a conventional junction where three electrical interconnects intersect.

Turning now to FIG. 5, illustrated is another embodiment of a conventional junction 500 where electrical interconnects intersect. An interconnect 510 formed along longitudinal axis A1 is again provided and intersects substantially perpendicular to an interconnect 520 formed along longitudinal axis A2. In this embodiment, interconnect 520 is configured to receive a flow of electrical current from interconnect 510.

This embodiment of a conventional circuit layout includes non-conducting slots 530, rather than the circular obstacles 430 mentioned above. Some conventional approaches have incorporated such slots 530 periodically dispersed along the lengths of the interconnects 510, 520 in attempt to combine the benefits provided with a typical solid conductive interconnect along with the advantages of the spaces/traces construction discussed with respect to FIG. 2.

However, even when employing the non-conductive slots 530, as electrical current flows from interconnect 510 through the junction 500 and into interconnect 520, the current must again turn at about a right angle in the junction 500 because the slots 530 are oriented with their sides perpendicular to the interconnect 510, and thus perpendicular to the incoming flow of current. As a result, current crowding may still be prevalent in the junction 500 area where the interconnects 510, 520 intersect. Moreover, designers and manufactures have little if any incentive to reorient the sides of the slots 530 to a direction more friendly to the flow of current at the junction 500 since to do so will impact the flow of current along the actual interconnects. Thus, even this conventional interconnect layout still suffers from the disadvantages discussed above.

Figure 6:
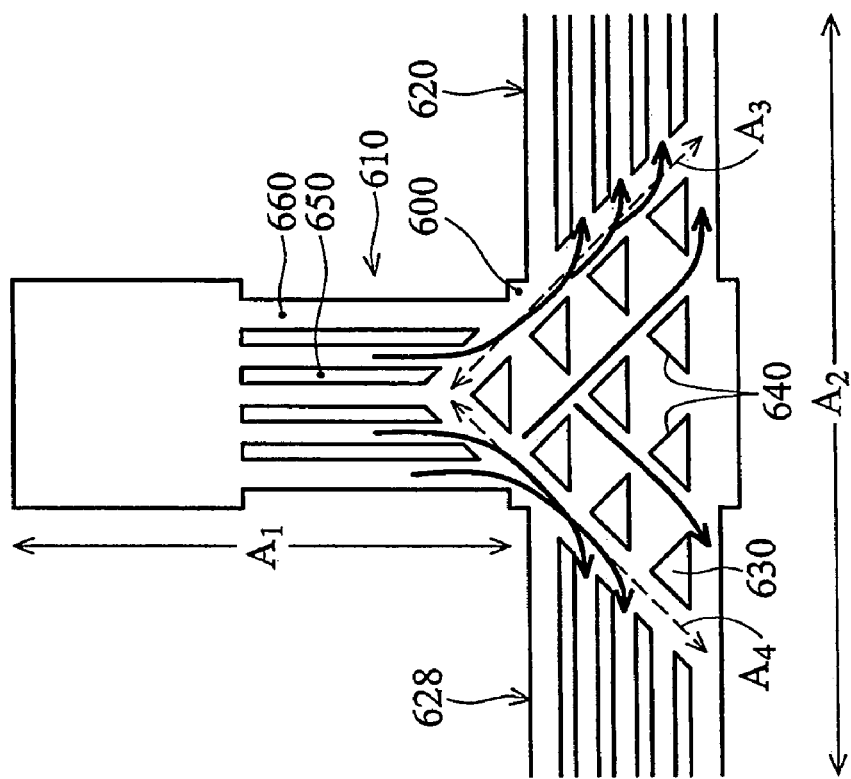
FIG. 6 illustrates an embodiment of a junction between three electrical interconnects according to the principles disclosed herein.

Turning now to FIG. 6, illustrated is another embodiment of a junction 600 between electrical interconnects according to the principles disclosed herein. Interconnect 610 has a length parallel to a longitudinal axis A1 and is orientated substantially perpendicular to interconnect 620, which has a length parallel to a longitudinal axis A2. A third interconnect 628 is also provided and has a length parallel to longitudinal axis A2, and is substantially perpendicular to interconnect 610.

The junction 600 again includes a number of current deflecting devices (one of which is labeled 630), rather than the conventional obstacles or slots discussed above, and each of the current deflecting devices 630 includes multiple deflecting surfaces 640 for aiding, rather than hindering, the flow of current through the junction 600. More specifically, the deflecting surfaces 640 are oriented so that they are non-perpendicular to the current flow coming through the interconnects 610, 620, 628. Moreover, by selecting the illustrated triangular shape or the current deflecting devices 630 and the orientation of the deflecting surfaces 640, the benefits provided by a junction 600 as disclosed herein may be provided no matter what direction the current flows. In this respect, one set of deflecting surfaces 640 is oriented along a diagonal axis A3 that is tilted to the least perpendicular orientation with respect to both longitudinal axes A1 and A2 (and thus interconnects 610 and 620). Since axes A1 and A2 are substantially perpendicular in this embodiment, axes A3, and therefore one set of the deflecting surfaces 640 (i.e., the right sides), may be optimally oriented at 45 degrees with respect to either axis A1 or A2. Similarly, another set of deflecting surfaces 640 is oriented along another diagonal axis A4, which is also optimally oriented at about 45 degrees with respect to either axis A1 or A2. Since deflecting surfaces 640 are provided non-perpendicularly towards all three interconnects 610, 620, 628, current can flow well in any direction with the embodiment illustrated in FIG. 6. Of course, in other embodiments, the orientation of the deflecting surfaces 640 may be selected so as to provide the best electrical current flow from any one interconnect to another, even if those interconnects do not intersect substantially a right angles.

Still further illustrated in the embodiment of FIG. 6 is the use of non-conductive spaces (one of which is labeled 650) extending most of their respective lengths of the interconnects 610, 620, 628. As before, such spaces 650 divide each of the interconnects 610, 620, 628 into a group of parallel, but electrically interconnected, metal traces (one of which is labeled 660). As can be seen in this embodiment, when such traces 660 and spaces 650 are employed, the lengths of the spaces 650 and traces 660 may be tapered when moving from one side of an interconnect 610, 620, 628 to the other. When this tapering is employed, the deflecting devices 630 may be carried up out of the junction 600 area and extend somewhat into the interconnects themselves, as discussed with respect to FIG. 2. While not required, such tapering can further reduce current crowding by further assisting in directing the flow of electrical current from one interconnect to another along either axis A3 or A4.

Figure 7:
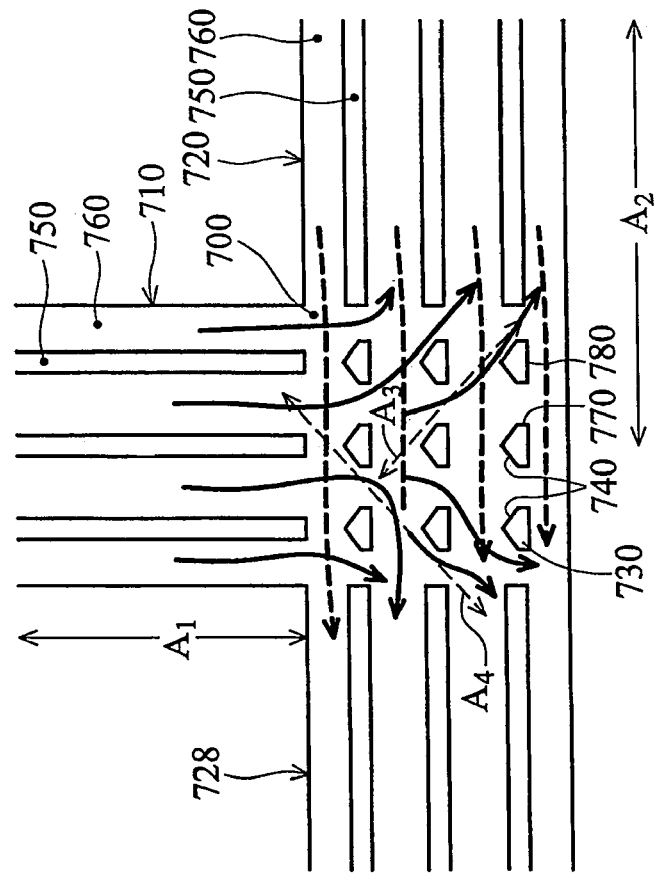
FIG. 7 illustrates another embodiment of a junction between three electrical interconnects according to the principles disclosed herein.

Looking now at FIG. 7, illustrated is yet another embodiment of a junction 700 between electrical interconnects according to the principles disclosed herein. Interconnect 710 has a length parallel to a longitudinal axis A1 and is orientated substantially perpendicular to interconnect 720, which has a length parallel to a longitudinal axis A2. A third interconnect 728 is also illustrated and has a length parallel to longitudinal axis A2, and is substantially perpendicular to interconnect 710 as well. As in other embodiments, non-conductive spaces (one of which is labeled 750), which provide parallel metal traces (one of which is labeled 760), extend most of the lengths of the interconnects 710, 720, 728, but are not required.

This embodiment of the junction 700 also includes a number of current deflecting devices (one of which is labeled 730), rather than the conventional obstacles discussed above, but of a different shape than those discussed with respect to other embodiments. More specifically, the current deflecting devices 730 in this embodiment have a pentagon shape, with two deflecting surfaces 740 oriented in the disclosed non-perpendicular manner towards the current flow of each of the three interconnects 710, 720, 728. As before, the current deflecting surfaces 740 are oriented along respective diagonal axes A3, A4 that are tilted to the least perpendicular orientation with respect to both longitudinal axes A1 and A2. The multiple deflecting surfaces 740 again aid the flow of electrical current through the junction 700, as illustrated, by reducing current crowding in the junction 700 regardless of the origin of the current flow. Since deflecting surfaces 740 are provided in a non-perpendicular orientation towards all three interconnects 710, 720, 728, current can flow well in any direction with the embodiment illustrated in FIG. 7. Of course, as before, the orientation of the deflecting surfaces 740 may be selected so as to provide the best electrical current flow from any one particular interconnect to another, even if those interconnects do not intersect substantially a right angles.

In addition to the two current deflecting surfaces 740, the pentagonal shape of the current deflecting devices 730 provide further benefits to the flow of current through the junction 700. Specifically, the length of the vertical sides (one of which is labeled 770) of the current deflecting devices 730 may be selected based on the width of the spaces 750 of interconnects 720 and 728. As such, the sides 770 of the current deflecting devices 730 may be oriented in the same lateral positions of the spaces 750 so that current flowing from interconnect 720 or 728 does not substantially impact the sides 770. Thus, such a current flow from traces 760 of either of these interconnects 720, 728 is substantially directed around the bases (one of which is labeled) 780 of the current deflecting devices 730 or the deflecting surfaces 740 (see dashed current flow lines).

Since the current deflecting devices 230, 330, 630, 730 are spreading in the junctions 200, 300, 600, 700, respectively, there is defined a pattern density by the sum of the area of all the current deflecting devices to the area of their respective junction. Thus, as mentioned with reference to FIG. 2, in most if not all embodiments to help balance the electrical performance (e.g., less non-conductive area in interconnects 210 and 220) and to help prevent potential dishing in interconnects during the planarizing process (e.g., more non-conductive area with higher hardness to prevent dishing issues), the pattern density of 20% to 80% has been found to be an advantageous range.

Figure 8:
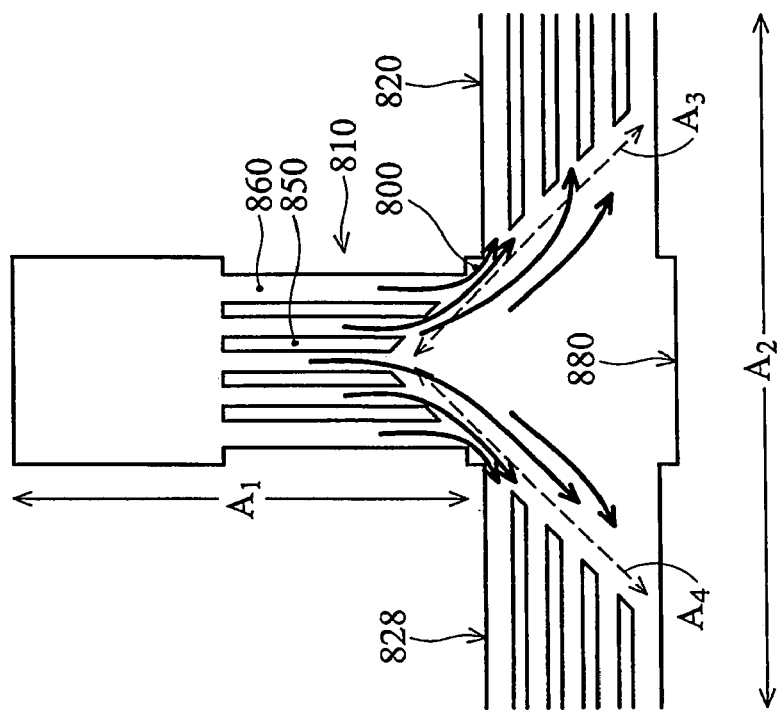
FIG. 8 illustrates an embodiment of a junction between three electrical interconnects according to the disclosed principles, but where no current deflecting devices are employed.

Turning finally to FIG. 8, illustrated is another embodiment of a junction 800 between electrical interconnects according to the principles disclosed herein. Interconnect 810 has a length parallel to a longitudinal axis A1 and is orientated substantially perpendicular to interconnect 820, which has a length parallel to a longitudinal axis A2. A third interconnect 828 is also illustrated and has a length parallel to longitudinal axis A2, and is substantially perpendicular to interconnect 810, as seen in several other embodiments disclosed herein. Also as in other embodiments, non-conductive spaces (one of which is labeled 850) extend most of the lengths of the interconnects 810, 820, 828 and provide parallel metal traces (one of which is labeled 860) for the interconnects 810, 820, 828.

This embodiment of the junction 800, however, does not include any current deflecting devices located in the junction 800 area. Instead, the lengths of the spaces 850 and traces 860 are tapered when moving from one side of an interconnect 810, 820, 828 to the other, as seen in some other embodiments, to provide the current directing feature of the junction. The tapering in this embodiment is in two directions (since three interconnects are employed) and follows either diagonal axis A3 or A4, which are substantially non-perpendicular to the current flow in any of the interconnects 810, 820, 828. When such tapering is employed, even without physical deflecting devices, current crowding may still be reduced because the tapering results in the current flow following the direction of the taper, as discussed in detail above. Therefore, the flow of current from one interconnect drifts towards the other interconnects rather than being directed straight into a wall 880 in the junction 800 that is substantially perpendicular to the flow of current (e.g., coming from interconnect 810). Although current flow is only illustrated from interconnect 810 to interconnects 820 and 828, current can also flow in any other direction(s) while still benefiting from the reduced current crowding provided by the illustrated tapering of the junction 800.

While various embodiments of electrical interconnect junctions capable of reducing current crowding according to the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A junction where electrical interconnects on a semiconductor substrate intersect and used to direct electrical current flowing into it in one direction toward another direction, the junction comprising:
   a portion of at least one current providing electrical interconnect having a length parallel to a longitudinal axis thereof and configured to provide a flow of electrical current;
   a portion of at least one current receiving electrical interconnect having a length parallel to a longitudinal axis thereof and configured to intersect with the at least one current providing interconnect at the junction in order to receive the flow of electrical current from the at least one current providing interconnect; and
   at least one current directing feature positioned between the current providing and current receiving interconnects, and oriented substantially non-perpendicular to the longitudinal axis of the at least one current providing interconnect.

2. A junction according to claim 1, wherein the at least one current providing interconnect intersects with the at least one current receiving interconnect at substantially a right angle.

3. A junction according to claim 1, wherein the at least one current directing feature is a current directing feature having at least one deflecting surface non-perpendicular to the longitudinal axis of the at least one current providing interconnect, the at least one current deflecting surface configured to deflect a portion of the current flowing into the junction substantially towards the at least one current receiving interconnect.

4. A junction according to claim 3, wherein the at least one current deflecting surface has an angle of about 45 degrees with respect to the longitudinal axis of the at least one current providing interconnect.

5. A junction according to claim 3, wherein the at least one current directing feature comprises at least two current deflection surfaces each oriented non-perpendicular to the longitudinal axis of either the at least one current providing or at least one current receiving interconnects.

6. A junction according to claim 5, wherein the at least one current directing feature has a substantially triangular or pentagonal shape.

7. A junction according to claim 1, wherein the at least one current receiving interconnect comprises two interconnects, the longitudinal axis of the first of the current receiving interconnects substantially perpendicular to the longitudinal axis of the at least one current providing interconnect, and the longitudinal axis of the second of the current receiving interconnects substantially parallel with the longitudinal axis of the first of the current receiving interconnect.

8. A junction according to claim 1, wherein the at least one current receiving interconnect and the at least one current providing interconnect comprise four interconnects, and the longitudinal axes of the four interconnects are substantially perpendicular to each other.

9. A junction according to claim 7, wherein the at least one current directing feature comprises at least four current deflection surfaces each oriented non-perpendicular to the longitudinal axis of the current providing interconnect or the current receiving interconnects.

10. A junction according to claim 3, wherein the at least one current directing feature comprises the absence of electrically conductive material forming the junction.

11. A junction according to claim 10, wherein the ratio of the area of absence of electrically conductive material to the area of junction is about 20% to 80%.

12. A junction according to claim 10, wherein the absence of electrically conductive material within the at least one current directing feature comprises low-k dielectric material.

13. A junction according to claim 12, wherein the low-k dielectric material is selected from the group consisting of FSG and Black Diamond.

14. A junction according to claim 1, wherein the portion of the at least one current providing interconnect comprises a plurality of conductive traces separated by nonconductive spaces, and wherein the at least one current directing feature comprises unequal lengths of the plurality of conductive traces configured to taper an end of the at least one current providing interconnect substantially non-perpendicular to the current flow therefrom.

15. A junction according to claim 14, wherein the ratio of the area of the sum of nonconductive spaces to the area of the at least one current providing interconnect is about 20% to 80%.

16. A junction according to claim 14, wherein the nonconductive spaces comprise materials selecting from the group consisting of silicon oxide, silicon nitride, Fluorine-doped glass, Black Diamond, BLOk, SiLK, FLARE, or a combination thereof.

17. A junction according to claim 14, wherein the end of the at least one current providing interconnect is tapered to about 45 degrees with respect to the longitudinal axis of the at least one current providing interconnect.

18. A junction according to claim 14, wherein about one-half of the end is tapered in a direction opposite to the other one-half of the end.

19. A junction according to claim 14, wherein the portion of the at least one current receiving interconnect comprises a plurality of conductive traces separated by nonconductive spaces, and wherein the at least one current directing feature comprises unequal lengths of the plurality of conductive traces configured to taper an end of the at least one current receiving interconnect substantially non-perpendicular to the current flow within any of the interconnects.

20. A junction according to claim 19, wherein the area ratio of the nonconductive spaces to the at least one current receiving interconnect is about 20% to 80%.

21. A junction according to claim 19, wherein the nonconductive spaces comprise materials selecting from the group consisting of silicon oxide, silicon nitride, Fluorine-doped glass, Black Diamond, BLOk, SiLK, FLARE, or a combination thereof.

22. A junction according to claim 19, wherein the end of the at least one current receiving interconnect is tapered to about 45 degrees with respect to the longitudinal axis of the at least one current receiving interconnect.

23. A method of manufacturing a junction where electrical interconnects on a semiconductor substrate intersect and used to direct electrical current flowing into it in one direction toward another direction, the method comprising:
    forming a portion of at least one current providing electrical interconnect having a length parallel to a longitudinal axis thereof and configured to provide a flow of electrical current;
    forming a portion of at least one current receiving electrical interconnect having a length parallel to a longitudinal axis thereof and configured to intersect with the at least one current providing interconnect at the junction; and
    positioning at least one current directing feature between the current providing and current receiving interconnects, and said at least one current directing feature having at least one deflecting surface oriented substantially non-perpendicular to the current flow from the at least one current providing interconnect.

24. A method according to claim 23, further comprising intersecting the at least one current providing interconnect with the at least one current receiving interconnect at substantially a right angle.

25. A method according to claim 23, wherein the at least one current deflecting surface has an angle of about 45 degrees with respect to the longitudinal axis of the at least one current providing interconnect.

26. A method according to claim 23, wherein the at least one current directing feature comprises at least two current deflection surfaces each oriented non-perpendicular to the longitudinal axis of either the at least one current providing or at least one current receiving interconnects.

27. A method according to claim 26, wherein the at least one current directing feature has a substantially triangular or pentagonal shape.

28. A method according to claim 26, wherein forming a portion of at least one current providing interconnect further comprises forming corresponding portions of two current providing interconnects, the longitudinal axis of the first of the current providing interconnects substantially perpendicular to the longitudinal axis of the at least one current receiving interconnect and the longitudinal axis of the second of the current providing interconnects substantially parallel with the longitudinal axis of the at least one current receiving interconnect.

29. A method according to claim 28, wherein forming a portion of at least one current receiving interconnect further comprises forming corresponding portions of two current receiving interconnects, the longitudinal axis of the second of the current providing interconnects substantially parallel to the longitudinal axis of the first of the current receiving interconnects and the longitudinal axis of the first of the current providing interconnects substantially parallel with the longitudinal axis of the second of the current receiving interconnects.

30. A method according to claim 29, wherein positioning the at least one current directing feature comprises positioning at least one current directing feature having at least four current deflection surfaces, the positioning further comprising orienting at least one of the current deflection surfaces non-perpendicular to the longitudinal axis of any of the first or second current providing interconnect or the first or second current receiving interconnects.

31. A method according to claim 26, wherein forming a portion of at least one current receiving interconnect further comprises forming corresponding portions of two current receiving interconnects, the longitudinal axis of the first of the current receiving interconnects substantially perpendicular to the longitudinal axis of the at least one current providing interconnect and the longitudinal axis of the second of the current receiving interconnects substantially parallel with the longitudinal axis of the at least one current providing interconnect.

32. A method according to claim 23, wherein the at least one current directing feature comprises the absence of electrically conductive material forming the junction.

33. A method according to claim 23, wherein forming the portion of the at least one current providing interconnect comprises forming a plurality of conductive traces separated by nonconductive spaces, and wherein the at least one current directing feature comprises unequal lengths of the plurality of conductive traces configured to taper an end of the at least one current providing interconnect substantially non-perpendicular to the longitudinal axis thereof.

34. A method according to claim 33, wherein the end of the at least one current providing interconnect is tapered to about 45 degrees with respect to the longitudinal axis of the at least one current providing interconnect.

35. A method according to claim 34, wherein about one-half of the end is tapered in a direction opposite to the other one-half of the end.

36. A method according to claim 33, wherein the forming the portion of the at least one current receiving interconnect comprises forming a plurality of conductive traces separated by nonconductive spaces, and wherein the at least one current directing feature comprises unequal lengths of the plurality of conductive traces configured to taper an end of the at least one current receiving interconnect substantially non-perpendicular to the longitudinal axis of any of the interconnects.

37. A method according to claim 36, wherein the end of the at least one current receiving interconnect is tapered to about 45 degrees with respect to the longitudinal axis of the at least one current receiving interconnect.

38. A semiconductor device, comprising:
a semiconductor substrate having at least one component formed thereon;
a portion of at least one current providing electrical interconnect formed on the substrate and having a length parallel to a longitudinal axis thereof and configured to provide a flow of electrical current;
a portion of at least one current receiving electrical interconnect formed on the substrate and having a length parallel to a longitudinal axis thereof and configured to receive a flow electrical current; and
a junction formed on the substrate where the portion of at least one current providing electrical interconnect and the portion of at least one current receiving electrical interconnect intersect, the junction comprising at least one current directing feature positioned between the at least one current providing and at least one current receiving interconnects, and oriented substantially non-perpendicular to the longitudinal axis of the at least one current providing interconnect to direct electrical current to the at least one current receiving electrical interconnect.

39. A semiconductor device according to claim 38, wherein the at least one current directing feature is a current directing feature having at least one deflecting surface non-perpendicular to the longitudinal axis of the at least one current providing interconnect, the at least one current deflecting surface configured to deflect a portion of the current flowing into the junction substantially towards the at least one current receiving interconnect.

40. A semiconductor device according to claim 38, wherein the at least one current receiving interconnect comprises two interconnects, the longitudinal axis of the first of the current receiving interconnects substantially perpendicular to the longitudinal axis of the at least one current providing interconnect, and the longitudinal axis of the second of the current receiving interconnects substantially parallel with the longitudinal axis of the first of the current receiving interconnect, and wherein the at least one current directing feature comprises at least two current deflection surfaces each oriented non-perpendicular to the longitudinal axis of either the at least one current providing or at least one current receiving interconnects.

41. A semiconductor device according to claim 38, wherein the at least one current receiving interconnect and the at least one current providing interconnect comprise four interconnects, and the longitudinal axes of the four interconnects are substantially perpendicular to each other, and wherein the at least one current directing feature comprises at least four current deflection surfaces each oriented non-perpendicular to the longitudinal axis of the current providing interconnect or the current receiving interconnects.

42. A semiconductor device according to claim 38, wherein the at least one current directing feature comprises the absence of electrically conductive material forming the junction.

43. A semiconductor device according to claim 42, wherein the absence of electrically conductive material within the at least one current directing feature comprises low-k dielectric material.

44. A semiconductor device according to claim 38, wherein the portion of the at least one current providing interconnect comprises a plurality of conductive traces separated by nonconductive spaces, and wherein the at least one current directing feature comprises unequal lengths of the plurality of conductive traces configured to taper an end of the at least one current providing interconnect substantially non-perpendicular to the current flow therefrom.

45. A semiconductor device according to claim 38, wherein the portion of the at least one current receiving interconnect comprises a plurality of conductive traces separated by nonconductive spaces, and wherein the at least one current directing feature comprises unequal lengths of the plurality of conductive traces configured to taper an end of the at least one current receiving interconnect substantially non-perpendicular to the current flow within any of the interconnects.

46. A method of manufacturing a semiconductor device, the method comprising:
forming a semiconductor substrate having at least one component formed thereon;
forming a portion of at least one current providing electrical interconnect on the substrate and having a length parallel to a longitudinal axis thereof and configured to provide a flow of electrical current;
forming a portion of at least one current receiving electrical interconnect on the substrate and having a length parallel to a longitudinal axis thereof and configured to receive a flow electrical current; and
forming a junction on the substrate where the portion of at least one current providing electrical interconnect and the portion of at least one current receiving electrical interconnect intersect, forming the junction further comprising positioning at least one current directing feature between the at least one current providing and at least one current receiving interconnects, and oriented substantially non-perpendicular to the longitudinal axis of the at least one current providing interconnect to direct electrical current to the at least one current receiving electrical interconnect.

47. A method according to claim 46, wherein the at least one current directing feature is a current directing feature having at least one deflecting surface non-perpendicular to the longitudinal axis of the at least one current providing interconnect, the at least one current deflecting surface configured to deflect a portion of the current flowing into the junction substantially towards the at least one current receiving interconnect.

48. A method according to claim 46, wherein the at least one current receiving interconnect comprises two interconnects, the longitudinal axis of the first of the current receiving interconnects substantially perpendicular to the longitudinal axis of the at least one current providing interconnect, and the longitudinal axis of the second of the current receiving interconnects substantially parallel with the longitudinal axis of the first of the current receiving interconnect, and wherein the at least one current directing feature comprises at least two current deflection surfaces each oriented non-perpendicular to the longitudinal axis of either the at least one current providing or at least one current receiving interconnects.

49. A method according to claim 46, wherein forming the at least one current receiving interconnect and the at least one current providing interconnect comprises forming four interconnects, wherein the longitudinal axes of the four interconnects are substantially perpendicular to each other, and wherein forming the at least one current directing feature comprises forming at least one current directing feature having at least four current deflection surfaces each oriented non-perpendicular to the longitudinal axis of the current providing interconnect or the current receiving interconnects.

50. A method according to claim 46, wherein positioning the at least one current directing feature comprises providing an absence of electrically conductive material forming the junction to form the current directing feature.

51. A method according to claim 50, wherein the absence of electrically conductive material within the at least one current directing feature comprises low-k dielectric material.

52. A method according to claim 46, wherein forming the portion of the at least one current providing interconnect comprises forming the at least one current providing interconnect having a plurality of conductive traces separated by nonconductive spaces, and wherein positioning the at least one current directing feature comprises providing unequal lengths of the plurality of conductive traces configured to taper an end of the at least one current providing interconnect substantially non-perpendicular to the longitudinal axis thereof.

53. A method according to claim 46, wherein forming the portion of the at least one current receiving interconnect comprises forming the at least one current receiving interconnect having a plurality of conductive traces separated by nonconductive spaces, and wherein positioning the at least one current directing feature comprises providing unequal lengths of the plurality of conductive traces configured to taper an end of the at least one current receiving interconnect substantially non-perpendicular to the longitudinal axis of any of the interconnects.

* * * * *